(12) United States Patent
Chen et al.

(10) Patent No.: US 10,453,933 B2
(45) Date of Patent: Oct. 22, 2019

(54) BARRIER LAYER FOR DIELECTRIC LAYERS IN SEMICONDUCTOR DEVICES

(71) Applicant: Taiwan Semiconductor Manufacturing Company, Ltd., Hsin-Chu (TW)

(72) Inventors: Sheng-Wen Chen, Tainan (TW); Yu-Ting Lin, Tainan (TW); Che-Hao Chang, Hsin-Chu (TW); Wei-Ming You, Taipei (TW); Ting-Chun Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 15/336,136

(22) Filed: Oct. 27, 2016

(65) Prior Publication Data

US 2017/0047420 A1 Feb. 16, 2017

Related U.S. Application Data

(62) Division of application No. 14/231,190, filed on Mar. 31, 2014, now Pat. No. 9,508,548.

(51) Int. Cl.
*H01L 29/40* (2006.01)
*H01L 29/49* (2006.01)
(Continued)

(52) U.S. Cl.
CPC ...... *H01L 29/4941* (2013.01); *H01L 21/0234* (2013.01); *H01L 21/0254* (2013.01);
(Continued)

(58) Field of Classification Search
CPC .......... H01L 29/4966; H01L 29/42364; H01L 29/6656; H01L 29/45; H01L 29/0847; H01L 21/26513; H01L 29/7833; H01L 29/665; H01L 29/517; H01L 21/28176; H01L 29/66545; H01L 29/6659; H01L 21/0254; H01L 21/28026; H01L 21/21; H01L 21/28185; H01L 21/02247; H01L 21/28088; H01L 21/0234; H01L 21/321; H01L 29/513; H01L 29/66583
(Continued)

(56) References Cited

U.S. PATENT DOCUMENTS 6,566,205 B1 5/2003 Yu et al.
8,877,625 B1 * 11/2014 Lian ................ H01L 21/823462
257/327
(Continued)

*Primary Examiner* — Shouxiang Hu
(74) *Attorney, Agent, or Firm* — Slater Matsil, LLP

(57) ABSTRACT

A semiconductor device having a high-k gate dielectric, and a method of manufacture, is provided. A gate dielectric layer is formed over a substrate. An interfacial layer may be interposed between the gate dielectric layer and the substrate. A barrier layer, such as a TiN layer, having a higher concentration of nitrogen along an interface between the barrier layer and the gate dielectric layer is formed. The barrier layer may be formed by depositing, for example, a TiN layer and performing a nitridation process on the TiN layer to increase the concentration of nitrogen along an interface between the barrier layer and the gate dielectric layer. A gate electrode is formed over the barrier layer.

20 Claims, 6 Drawing Sheets

(51) Int. Cl.
*H01L 21/02* (2006.01)
*H01L 21/28* (2006.01)
*H01L 29/66* (2006.01)
*H01L 29/51* (2006.01)
*H01L 21/265* (2006.01)
*H01L 29/08* (2006.01)
*H01L 29/423* (2006.01)
*H01L 29/45* (2006.01)
*H01L 29/78* (2006.01)
*H01L 21/321* (2006.01)

(52) U.S. Cl.
CPC .. *H01L 21/02247* (2013.01); *H01L 21/26513* (2013.01); *H01L 21/28026* (2013.01); *H01L 21/28088* (2013.01); *H01L 21/28176* (2013.01); *H01L 21/28185* (2013.01); *H01L 29/0847* (2013.01); *H01L 29/42364* (2013.01); *H01L 29/45* (2013.01); *H01L 29/4966* (2013.01); *H01L 29/517* (2013.01); *H01L 29/665* (2013.01); *H01L 29/6656* (2013.01); *H01L 29/6659* (2013.01); *H01L 29/66545* (2013.01); *H01L 29/66583* (2013.01); *H01L 29/7833* (2013.01); *H01L 21/321* (2013.01); *H01L 29/513* (2013.01)

(58) Field of Classification Search
USPC .................................................. 257/751, 412
See application file for complete search history.

(56) References Cited

U.S. PATENT DOCUMENTS

| | | |
|---|---|---|
| 2005/0258499 A1* | 11/2005 | Huang ............. H01L 21/28052 257/382 |
| 2006/0131672 A1 | 6/2006 | Wang et al. |
| 2010/0120245 A1 | 5/2010 | Tjandra et al. |
| 2011/0230042 A1 | 9/2011 | Chew et al. |
| 2015/0069533 A1 | 3/2015 | Lin et al. |
| 2015/0279745 A1 | 10/2015 | Xu et al. |
| 2015/0279954 A1 | 10/2015 | Chen et al. |

* cited by examiner

BARRIER LAYER FOR DIELECTRIC LAYERS IN SEMICONDUCTOR DEVICES

PRIORITY CLAIM AND CROSS-REFERENCE

This is a divisional application of U.S. application Ser. No. 14/231,190, entitled "Method For Forming Barrier Layer For Dielectric Layers In Semiconductor" which was filed on Mar. 31, 2014 and is incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
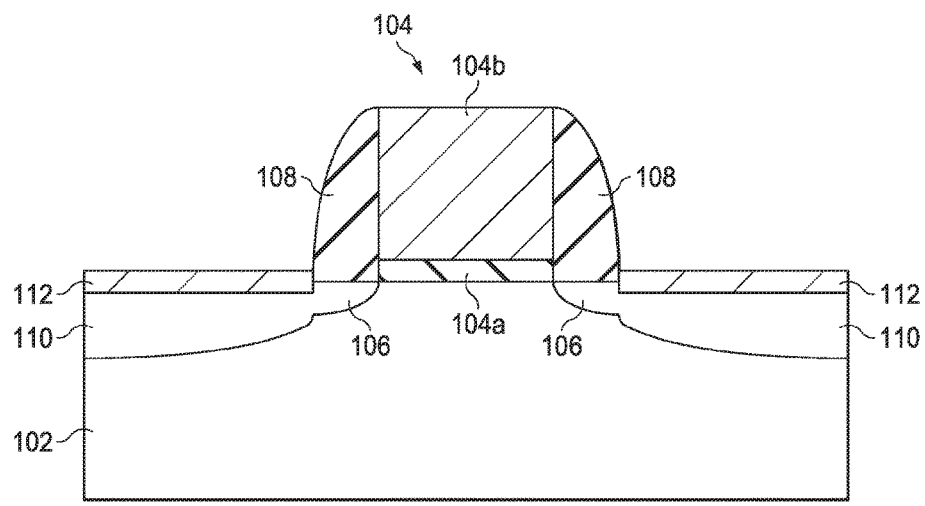
FIGS. 1-6 illustrate various intermediate stages of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A barrier layer for a dielectric layer, and a method of manufacture, to reduce or prevent oxide regrowth during subsequent processing is provided. Illustrative embodiments discussed herein are in the context of forming a high-k gate dielectric for a planar transistor. Embodiments are discussed in terms of a gate-last approach as well as a gate-first approach. Features of the present disclosure may be used in other contexts in which, for example, oxide regrowth during subsequent processing may be an issue, including other types of transistors, capacitors, or the like.

FIGS. 1-6 illustrate an embodiment of forming a gate electrode in accordance with some embodiments. Referring first to FIG. 1, there is shown a substrate 102 having a dummy gate stack 104 formed thereon. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as multi-layered or gradient substrates may also be used.

As discussed in greater detail below, the dummy gate stack 104 is a sacrificial structure used to align and form source/drain regions adjacent to the dummy gate stack 104 and will be replaced in subsequent processing steps. As such, the dummy gate stack 104 may be formed of any suitable materials and processes. In some embodiments, the dummy gate stack 104 is formed simultaneously as other devices on the wafer, such as other transistors. In these embodiments, it may be desirable to form the dummy gate stack 104 from a dummy gate dielectric 104a and a dummy gate electrode 104b, which layers may be used to form functional gate stacks for other devices.

Lightly-doped source/drain (LDD) regions 106 are formed by implanting dopants, e.g., n-type dopants or p-type dopants, using the dummy gate stack 104 as a mask, thereby aligning the LDD regions 106 with the edges of dummy gate stack 104. Halo and/or pocket regions (not shown) may also be formed.

FIG. 1 further illustrates the formation of gate spacers 108 along sidewalls of the dummy gate stack 104. In some embodiments, the gate spacers 108 are formed by depositing one or more layers of a dielectric material and performing an anisotropic etch to remove the dielectric material other than that dielectric material adjacent the dummy gate stack 104. For example, in some embodiments the gate spacers 108 are formed from a silicon nitride layer. The silicon nitride layer is patterned by either anisotropic wet etching or dry etching to remove horizontal portions of the silicon nitride layer to form the gate spacers 108 as illustrated in FIG. 1. In some embodiments the gate spacers 108 are formed from multiple layers. For example, in some embodiments the gate spacers 108 comprise a silicon oxide layer and an overlying silicon nitride layer.

Highly-doped source/drain regions 110 are formed by implanting dopants, e.g., n-type dopants or p-type dopants, using the dummy gate stack 104 and the gate spacers 108 as a mask, thereby aligning the highly-doped source/drain regions 110 with the edges of the gate spacers 108.

FIG. 1 also illustrates the formation of silicide regions 112. The silicide regions 112 may be formed by blanket depositing a thin layer of metal, such as nickel, platinum, cobalt, and combinations thereof, and then heating the substrate. The heating causes the substrate, e.g., silicon, to react with the metal where contacted. After the reaction, a layer of metal silicide is formed between the substrate and the metal. The un-reacted metal is selectively removed.

The structure provided above is for illustrative purposes only and other embodiments may utilize other structures and features. For example, some embodiments may incorporate buried stressors, recessed source/drain regions filled with a stressor, raised source/drain regions, different materials, different gate structure and materials, halo implants, different source/drain doping profiles, and the like.

Figure 2:
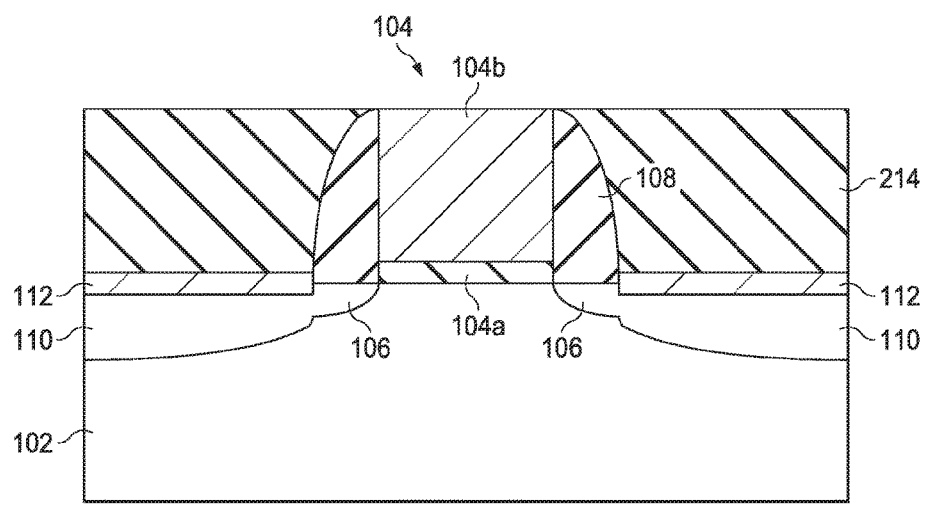

Referring to FIG. 2, a first inter-layer dielectric (ILD) layer 214 is formed in accordance with some embodiments. The first ILD layer 214 may be formed, for example, of a low-K dielectric material, such as a carbon-containing material, phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). The first ILD layer 214 may comprise a plurality of dielectric layers.

The first ILD layer 214 over the dummy gate stack 104 is removed, exposing the dummy gate stack 104. In some embodiments, a chemical mechanical polishing (CMP) process is used to planarize an upper surface of the first ILD layer 214 level with an upper surface of the dummy gate stack 104 as illustrated in FIG. 2.

Figure 3:
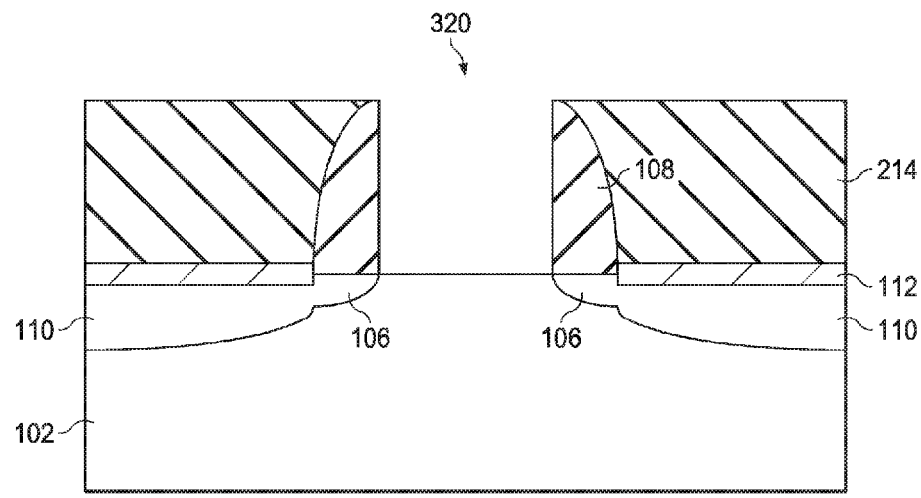

FIG. 3 illustrates the selective removal of the dummy gate stack 104 (see FIG. 2), thereby forming an opening 320, in accordance with some embodiments. In embodiments in which the dummy gate stack 104 is a polysilicon material, the dummy gate stack 104 may be selectively etched using either dry or wet etching. In the case dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. In the case wet etching is used, the chemicals may include $NH_4OH:H_2O_2:H_2O$ (APM), $NH_2OH$, KOH, $HNO_3:NH_4F:H_2O$, and/or the like.

In embodiments in which the dummy gate stack 104 includes a silicon oxide dummy gate dielectric 104a, the silicon oxide may be removed using a wet etch process using a dilute hydrofluoric acid. If similar materials are utilized for the ILD layer 214 and the dummy gate dielectric 104a, a mask may be used to protect the ILD layer 214 during removal of the dummy gate dielectric 104a.

Figure 4:
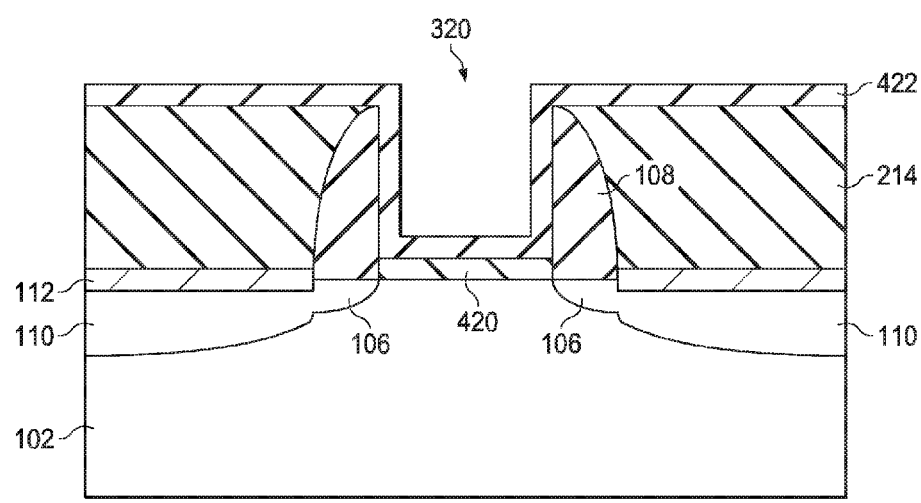

FIG. 4 illustrates formation of an interfacial layer 420 formed along a surface of the substrate in the opening 320 in accordance with some embodiments. The interfacial layer 420 helps buffer the substrate 102 and a subsequently formed high-k dielectric layer. In some embodiments, the interfacial layer 420 is a chemical silicon oxide, which may result from chemical reactions. For example, a chemical oxide may be formed using deionized water+ozone ($DIO_3$), $NH_4OH+H_2O_2+H_2O$ (APM), or other methods. Other embodiments may utilize a different material or processes for the interfacial layer 420. In an embodiment, the interfacial layer 420 may have a thickness of about 10 Å to about 30 Å.

A gate dielectric layer 422 is formed on the interfacial layer 420. In an embodiment, the gate dielectric layer 422 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTi_yO_z$, and the like. The formation methods include molecular-beam deposition (MBD), atomic layer deposition (ALD), physical vapor deposition (PVD), and the like. In an embodiment, the gate dielectric layer 422 may have a thickness of about 10 Å to about 50 Å.

Figure 5:
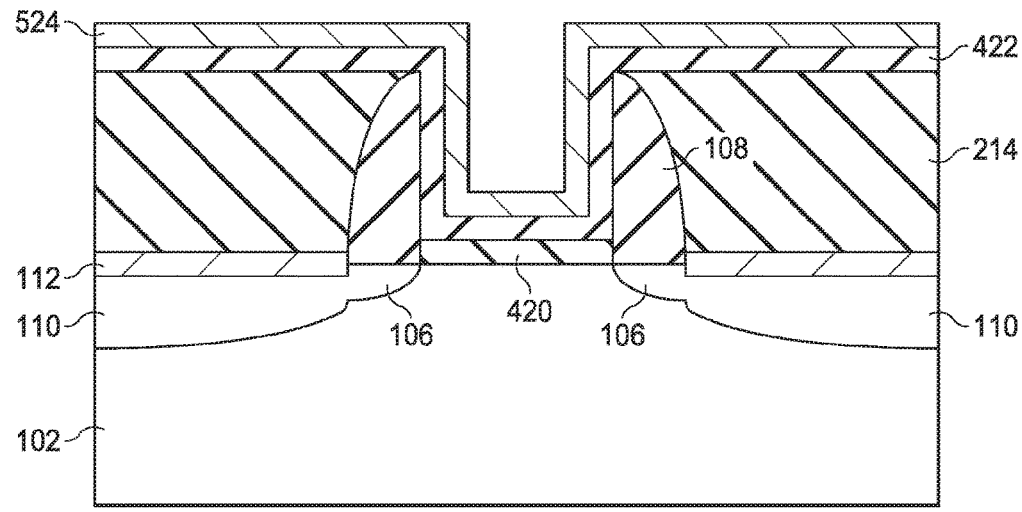

FIG. 5 illustrates a conductive layer 524 formed over the gate dielectric layer 422 in accordance with some embodiments. As will be discussed in greater detail below, the conductive layer 524 will be treated to enhance its ability to act as a barrier layer to reduce or prevent further oxidation or oxide regrowth in the underlying layers, such as the underlying gate dielectric layer 422. It has been found that oxide regrowth may occur during subsequent processing steps such as annealing as a result of oxygen penetration to the high-k dielectric layer. As will be described in greater detail below, the conductive layer 524 will be treated to increase the relative nitrogen concentration in the conductive layer 524 along the interface between the conductive layer 524 and the gate dielectric layer 422.

In some embodiments, the conductive layer 524 is formed of tantalum or titanium containing materials such as TiN, TaC, TaN, TaAlN, TaSiN, and combinations thereof. These metal-containing materials may be in the form of metal carbides, metal nitrides, or conductive metal oxides. For example, in some embodiments the conductive layer 524 is formed of TiN to a thickness of about 10 Å to about 100 Å. The formation methods of the conductive layer 524 include ALD, PVD, metal-organic chemical vapor deposition (MOCVD), and the like.

Thereafter, a treatment is performed to increase the ability of the conductive layer 524 to block oxygen penetration during subsequent processing steps. In some embodiments, the treatment is a decoupled plasma nitridation (DPN) process followed by an anneal process. The DPN may be performed using a nitrogen-containing process gas, such as $N_2$, $NH_3$, or the like. The anneal may be performed, for example, at a temperature of about 800° C. to about 1,000° C. for about 1 millisecond to about 50 seconds.

As a result of the above treatment, the resulting conductive layer 524 may be a gradient layer. For example, in an embodiment in which the conductive layer 524 is a TixNy layer, the top surface of the TiN layer may have a higher concentration of nitrogen relative to a concentration of nitrogen in the TiN layer at a location away from the top surface. In some embodiments the ratio of y:x may be about 1.0 to about 1.2 at the top surface of the TiN layer, and have a ratio of y:x of about 0.85 to about 0.98 at a location away from the top surface. Higher ratios such as these allow more effective protection against oxygen penetration during subsequent processing steps.

Figure 6:
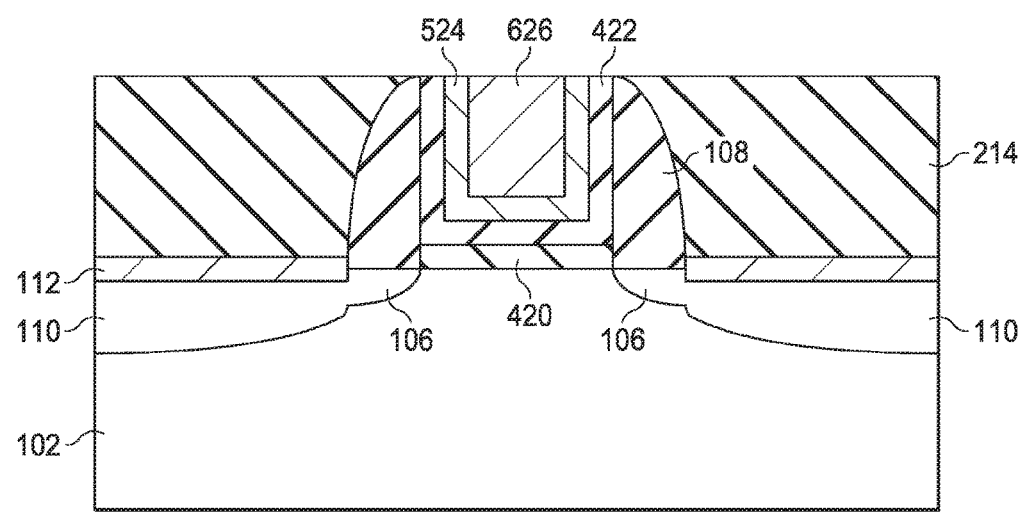

Referring now to FIG. 6, there is shown a gate electrode 626 formed over the conductive layer 524 in accordance with some embodiments. FIG. 6 illustrates a gate electrode 626 comprising a single layer for illustrative purposes only, and in some embodiments, the gate electrode 626 comprises one or more metal layers or other conductive layers. For example, in some embodiments, the gate electrode 626 may comprise one or more layers of Ti, Co, W, W alloys, Al, Al alloys, Cu, Cu alloys, and/or the like, wherein the various layers may be of a similar or different material. The formation methods of a gate electrode 626 include ALD, PVD, CVD, MOCVD, and the like.

The above description is a general description to provide context and an understanding of some embodiments. Other embodiments may include other layers and/or other processes. For example, in some embodiments a work metal function layer may be included. Generally, the work function of the gate electrode may be adjusted to the band-edge of the silicon; that is, for an NMOS device, adjusting the work function close to the conduction band, and for a PMOS device, adjusting the work function close to the valence band.

As another example, in some embodiments a Si-cap may be formed and post-capping anneal (PCA) processes may be performed to help reduce $O_2$ pass-through issues during processing. Generally, an amorphous silicon cap layer may be formed to limit the $O_2$ pass-through issues with the underlying layers. In some embodiments, the amorphous silicon cap layer is formed over the conductive layer 524 after performing the above treatment. The PCA process comprises an anneal to strengthen the ability of Si-capping layer to prevent $O_2$ pass-through.

Embodiments such as those disclosed herein provide better control over the gate dielectric. For example, devices using an interfacial layer and/or a high-k dielectric layer without a nitridation process may experience oxide regrowth issues during subsequent processing. Subsequent processing, such as annealing, may allow oxygen to penetrate the overlying layers and cause an oxide regrowth in the interfacial and/or the high-k dielectric layers.

By forming the conductive layer (e.g., the TiN layer) over the high-k dielectric layer and performing a treatment, a barrier layer that reduces or prevents oxygen from penetrating to the interfacial layer and/or a high-k dielectric layer is formed. The higher concentration of nitrogen along the interface effectively reduces or prevents the oxide regrowth issues.

Thereafter, additional processing may be performed to complete processing. For example, an additional ILD layer and contacts may be formed, metallization layers may be formed to interconnect the various devices to form circuits, external contacts may be formed, and other back-end of line (BEOL) processing may be performed.

The embodiment discussed above illustrates a gate-last approach for illustrative purposes, and FIGS. 7-11 illustrate an embodiment in which a gate-first approach is used for illustrative purposes. In the following discussion, like reference numerals refer to like elements and, accordingly, may be formed using the same processes and materials as described above and will not be discussed further. Other materials and processes may be used.

Figure 7:
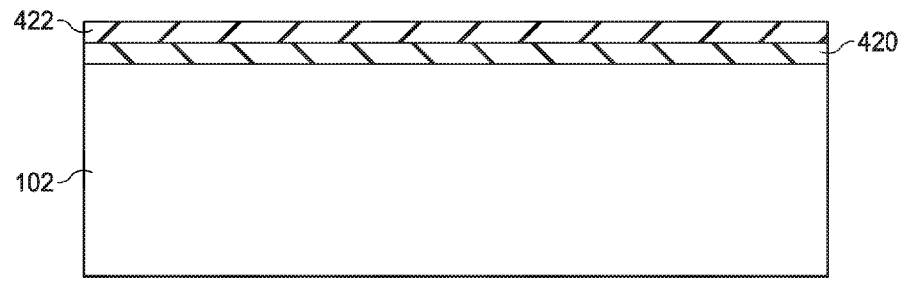
FIGS. 7-11 illustrate various intermediate stages of another method of forming a semiconductor device in accordance with some embodiments.

Referring first to FIG. 7, there is shown the substrate 102 having the interfacial layer 420 formed thereon and the gate dielectric layer 422 formed on the interfacial layer 420. In the embodiment illustrated in FIG. 7, the interfacial layer 420 and the gate dielectric layer 422 are layers formed over the surface of the substrate 102. During subsequent processing, the interfacial layer 420 and the gate dielectric layer 422 will be patterned.

Figure 8:
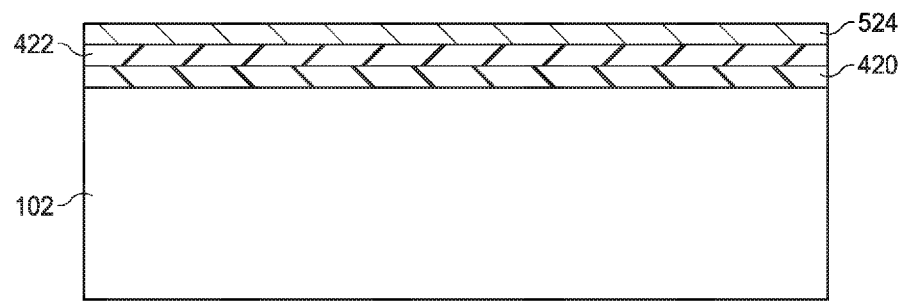

FIG. 8 illustrates formation of the conductive barrier layer 524 over the gate dielectric layer 422 in accordance with some embodiments. The conductive layer 524 may be treated as discussed above to increase the nitrogen concentration of the conductive layer 524 along an interface between the conductive layer 524 and the gate dielectric layer 422.

Figure 9:
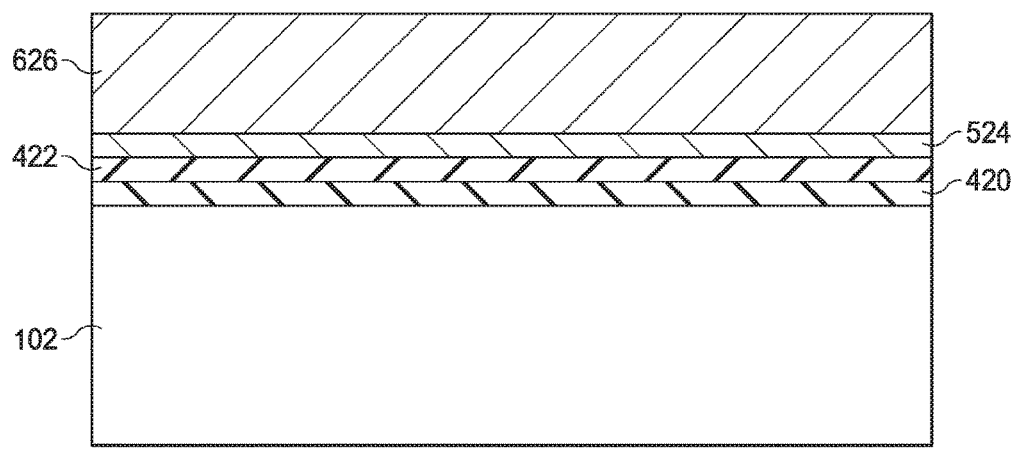

Thereafter, as illustrated in FIG. 9, a gate electrode layer 626 is formed. The gate electrode layer 626 is illustrated as a single layer. In some embodiments, the gate electrode layer 626 may include multiple layers, such as metal layers, polysilicon layers, and the like, and may include work function layers.

Figure 10:
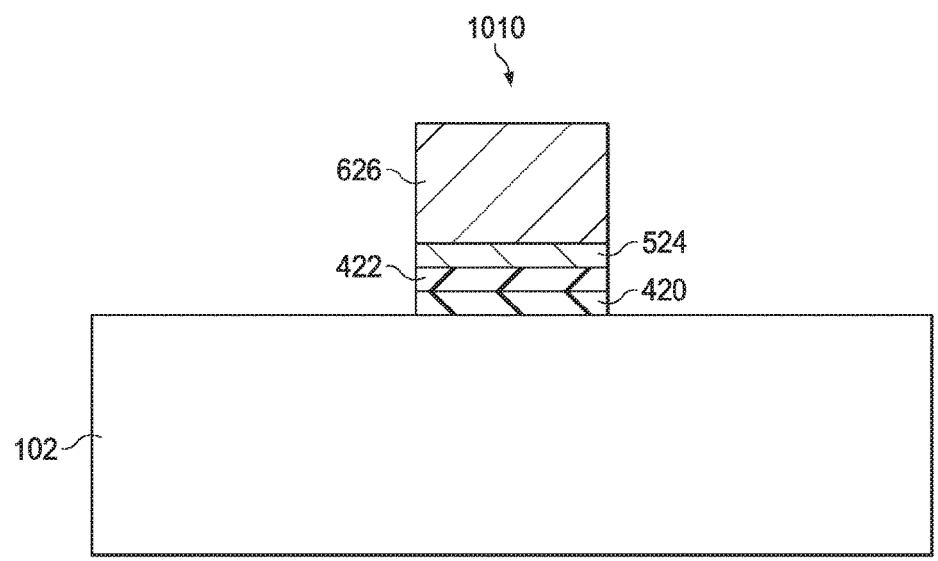

FIG. 10 illustrates patterning of the interfacial layer 420, the gate dielectric layer 422, the conductive layer 524, and the gate electrode layer 626 to form a gate stack 1010. These layers may be patterned using, for example, photolithography techniques to form a patterned mask (not shown) and one or more etch processes, such as wet or dry etch processes, to pattern the interfacial layer 420, the gate dielectric layer 422, the conductive layer 524, and the gate electrode layer 626 to form the gate stack 1010 as illustrated in FIG. 10.

Figure 11:
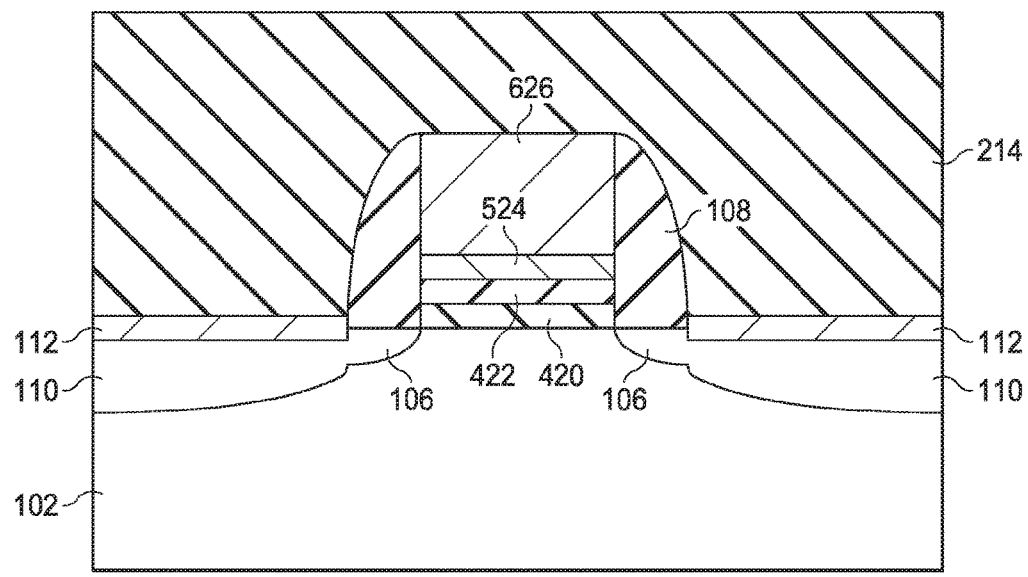

Thereafter, LDD regions 106, gate spacers 108, highly-doped source/drain regions 110, and silicide regions 112 may be formed as illustrated in FIG. 11. FIG. 11 further illustrates one or more overlying ILD layers 214.

Thereafter, additional processing may be performed to complete processing. For example, contacts may be formed extending through the ILD layer 214, metallization layers may be formed to interconnect the various devices to form circuits, external contacts may be formed, and other back-end of line (BEOL) processing may be performed.

Figure 12:
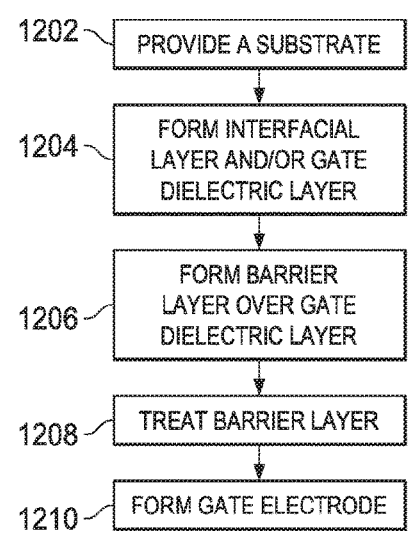
FIG. 12 is a flow diagram illustrating a process of forming a semiconductor device in accordance with some embodiments.

FIG. 12 illustrates a flow diagram depicting process steps that may be performed in manufacturing a semiconductor device in accordance with some embodiments. The process begins at step 1202, wherein a substrate is provided. In some embodiments, the substrate has an ILD layer formed thereon and a dummy gate stack formed extending through the ILD layer, similar to that discussed above with reference to FIGS. 1 and 2. The dummy gate stack is removed, thereby forming an opening in the ILD layer, similar to that discussed above with reference to FIG. 3.

Thereafter, in step 1204, an interfacial layer is formed over the substrate and a high-k dielectric layer is formed over the interfacial layer, similar to that discussed above with reference to FIGS. 4 and/or 7. In step 1206, a conductive barrier layer, such as a TiN layer, is formed over the high-k dielectric layer and, in step 1208, a treatment is performed, similar to that discussed above with reference to FIGS. 5 and/or 8. The treatment reduces or prevents oxygen from penetrating the conductive layer, thereby reducing or preventing oxide regrowth issues with the interfacial layer and/or the high-k dielectric layer. Thereafter, in step 1210, a gate electrode is formed over the conductive layer, similar to that discussed above with reference to FIGS. 6 and/or 9.

In an embodiment, a method of forming a semiconductor device is provided. The method includes forming an interfacial layer and forming a dielectric layer over the interfacial layer. A conductive layer is formed over the dielectric layer, and treatment is performed on the conductive layer to increase an oxygen-blocking ability of the conductive layer. In an embodiment, the treatment is a nitridation process.

In another embodiment, a method of forming a semiconductor device is provided. The method includes providing a substrate and forming a gate dielectric layer over the substrate. A barrier layer is formed over the gate dielectric layer and increasing a nitrogen concentration in the barrier layer along an interface between the barrier layer and the gate dielectric layer.

In yet another embodiment, a semiconductor device is provided. The semiconductor device includes a substrate having a gate dielectric layer thereover. A conductive layer is over the gate dielectric layer; and a gate electrode is over the conductive layer. The conductive layer has a higher relative nitrogen concentration along an interface between the gate dielectric and the conductive layer than at a first location away from the interface between the gate dielectric and the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a gate dielectric layer over a substrate;
   a conductive layer over and in contact with the gate dielectric layer, the conductive layer having a higher relative nitrogen concentration along a top surface than at a location away from the top surface;
   a silicon cap over and in contact with the conductive layer; and
   a metal gate electrode over and in contact with the silicon cap.

2. The semiconductor device of claim 1, wherein the conductive layer comprises a TixNy layer.

3. The semiconductor device of claim 2, wherein the TixNy layer comprises a ratio of y:x of about 1.0 to about 1.2 along the top surface of the conductive layer.

4. The semiconductor device of claim 3, wherein the TixNy layer comprises a ratio of y:x of about 0.85 to about 0.98 at a location away from the top surface of the conductive layer.

5. The semiconductor device of claim 1, further comprising gate spacers over the substrate and adjacent to the gate dielectric layer.

6. The semiconductor device of claim 5, further comprising an inter-layer dielectric over the substrate, the gate spacers and the metal gate electrode.

7. The semiconductor device of claim 6, further comprising:
   source/drain regions in the substrate; and
   a silicide region over each of the source/drain regions.

8. The semiconductor device of claim 1, further comprising an interfacial layer over the substrate.

9. The semiconductor device of claim 8, wherein the interfacial layer comprises an oxide layer.

10. A semiconductor device comprising:
    a raised structure over a substrate, the raised structure comprising:
      gate spacers;
      a gate dielectric layer over the substrate, the gate dielectric layer having a first horizontal portion and first vertical portions, the first vertical portions adjacent to the gate spacers;
      a conductive layer over and in contact with the gate dielectric layer, the conductive layer having a second horizontal portion and second vertical portions, the second vertical portions adjacent to the first vertical portions of the gate dielectric layer, wherein a top surface of the second horizontal portion has a higher nitrogen concentration than a location of the second horizontal portion away from the top surface;
      a silicon cap over and in contact with the conductive layer; and
      a gate electrode over and in contact with the silicon cap;
    a source/drain region on each side of the raised structure; and
    a silicide region over each source/drain region.

11. The semiconductor device of claim 10, further comprising an interfacial layer over the substrate.

12. The semiconductor device of claim 11, wherein the interfacial layer comprises an oxide layer.

13. The semiconductor device of claim 12, further comprising spacers over the substrate and adjacent to the first vertical portions of the gate dielectric layer.

14. The semiconductor device of claim 13, further comprising:
    an inter-layer dielectric over the substrate, the spacers, and the gate electrode; and
    a contact through the inter-layer dielectric, the contact contacting the gate electrode.

15. The semiconductor device of claim 10, wherein the first vertical portions, the second vertical portions, and the gate electrode are level.

16. The semiconductor device of claim 10, wherein the conductive layer comprises a TixNy layer, the nitrogen to titanium concentrations in the top surface having a ratio y:x of about 1.0 to about 1.2.

17. The semiconductor device of claim 16, wherein the conductive layer comprises a TixNy layer, the nitrogen to titanium concentrations in the location away from the top surface having a ratio y:x of about 0.85 to about 0.98.

18. A semiconductor device comprising:
    a substrate;
    a dielectric layer over the substrate, the dielectric comprising an oxide;
    a barrier layer over and in contact with the dielectric layer, the barrier layer comprising a first TixNy layer along a top surface of the barrier layer, a ratio of y:x being from about 1.0 to about 1.2 at the first TixNy layer, and the barrier layer comprising a second TixNy layer at a location away from the top surface of the barrier layer, a ratio of y:x of about 0.85 to about 0.98 at the second TixNy layer;
    a silicon cap over and in contact with the barrier layer;
    a metal gate electrode over and in contact with the silicon cap;
    sidewall spacers over the substrate, the metal gate electrode being interposed between the sidewall spacers;
    an inter-layer dielectric over the metal gate electrode; and
    a contact through the inter-layer dielectric and over the metal gate electrode.

19. The semiconductor device of claim 18, further comprising an interfacial layer over the substrate.

20. The semiconductor device of claim 18, further comprising:
- source/drain regions along a top surface of the substrate, the source/drain regions located on opposite sides of the dielectric layer;
- silicide regions over the source/drain regions; and
- sidewall spacers over the source/drain regions.

* * * * *